(12) United States Patent
Takahashi et al.

(10) Patent No.: US 12,211,695 B2
(45) Date of Patent: Jan. 28, 2025

(54) ETCHING METHOD AND ETCHING APPARATUS

(71) Applicant: Tokyo Electron Limited, Tokyo (JP)

(72) Inventors: Nobuhiro Takahashi, Nirasaki (JP); Ken Nakagomi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 277 days.

(21) Appl. No.: 17/839,869

(22) Filed: Jun. 14, 2022

(65) Prior Publication Data

US 2022/0399204 A1 Dec. 15, 2022

(30) Foreign Application Priority Data

Jun. 15, 2021 (JP) .................................. 2021-099662

(51) Int. Cl.
*H01L 21/3065* (2006.01)
*H01L 21/67* (2006.01)

(52) U.S. Cl.
CPC .... *H01L 21/3065* (2013.01); *H01L 21/67069* (2013.01)

(58) Field of Classification Search
None
See application file for complete search history.

(56) References Cited

U.S. PATENT DOCUMENTS

2015/0371889 A1* 12/2015 Kim .................. H01L 21/02381
 438/714
2022/0238309 A1* 7/2022 Luan .................. H01L 21/0234

FOREIGN PATENT DOCUMENTS

JP 2012-201102 A 10/2012
JP 2020-053448 A 4/2020
KR 10-2020-0035213 A 4/2020

* cited by examiner

*Primary Examiner* — Roberts P Culbert
(74) *Attorney, Agent, or Firm* — Nath, Goldberg & Meyer; Jerald L. Meyer; Tanya E. Harkins

(57) ABSTRACT

An etching method includes: accommodating a substrate having a recess formed by a sidewall, which is a germanium-containing film, into a processing container; etching the sidewall by supplying an etching gas including a first fluorine-containing gas and a second fluorine-containing gas into the processing container; and controlling a shape of the sidewall after etching by, in the etching the sidewall, adjusting a partial pressure of the first fluorine-containing gas in the processing container, or a ratio of a flow rate of the second fluorine-containing gas to a flow rate of the first fluorine-containing gas supplied into the processing container.

17 Claims, 9 Drawing Sheets

FIG. 5
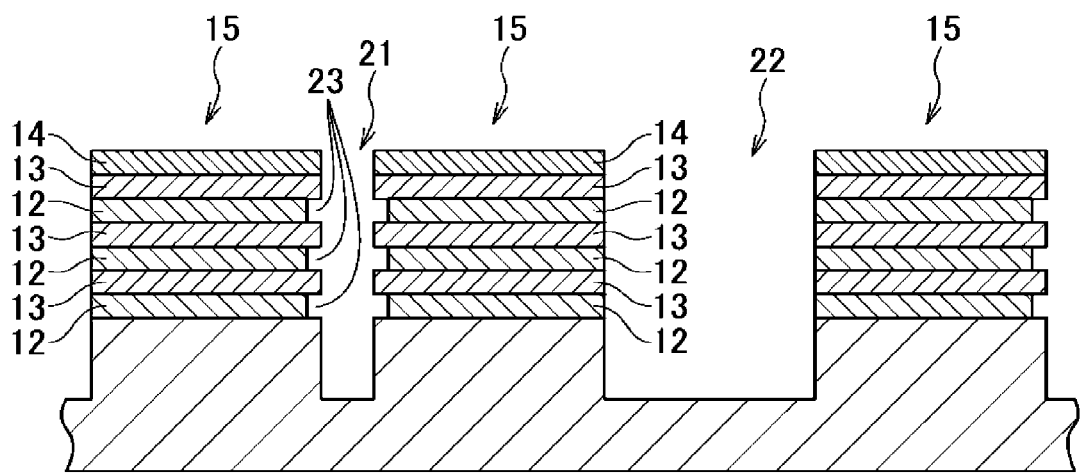
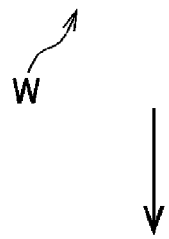
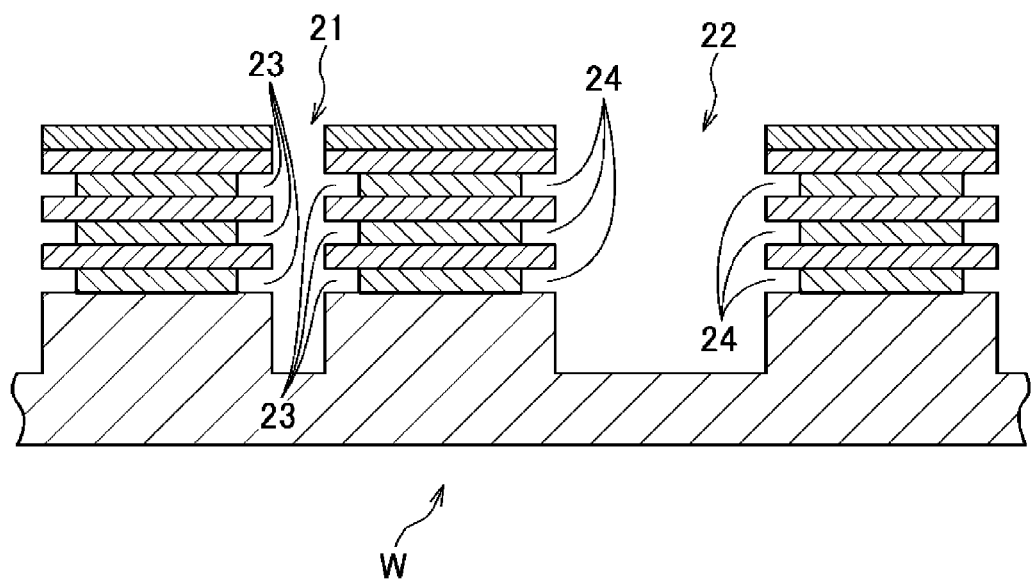

FIG. 6
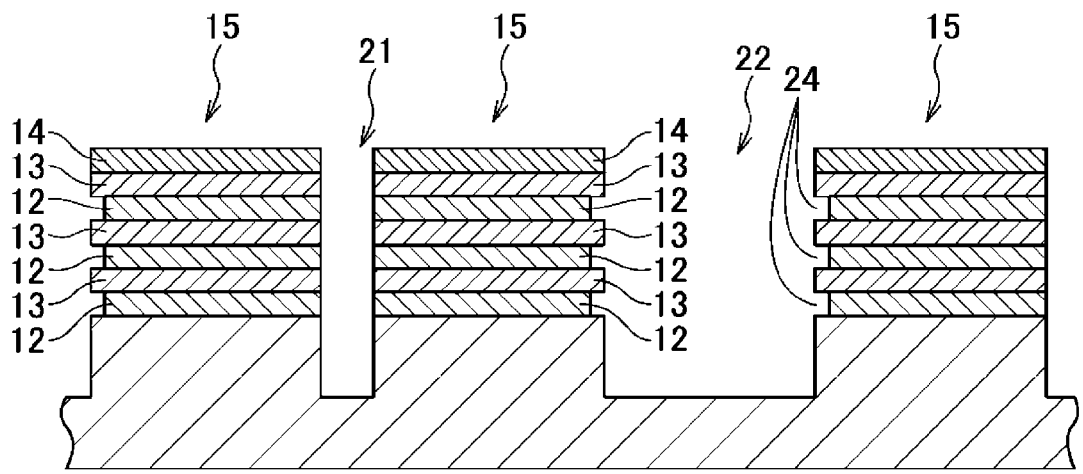
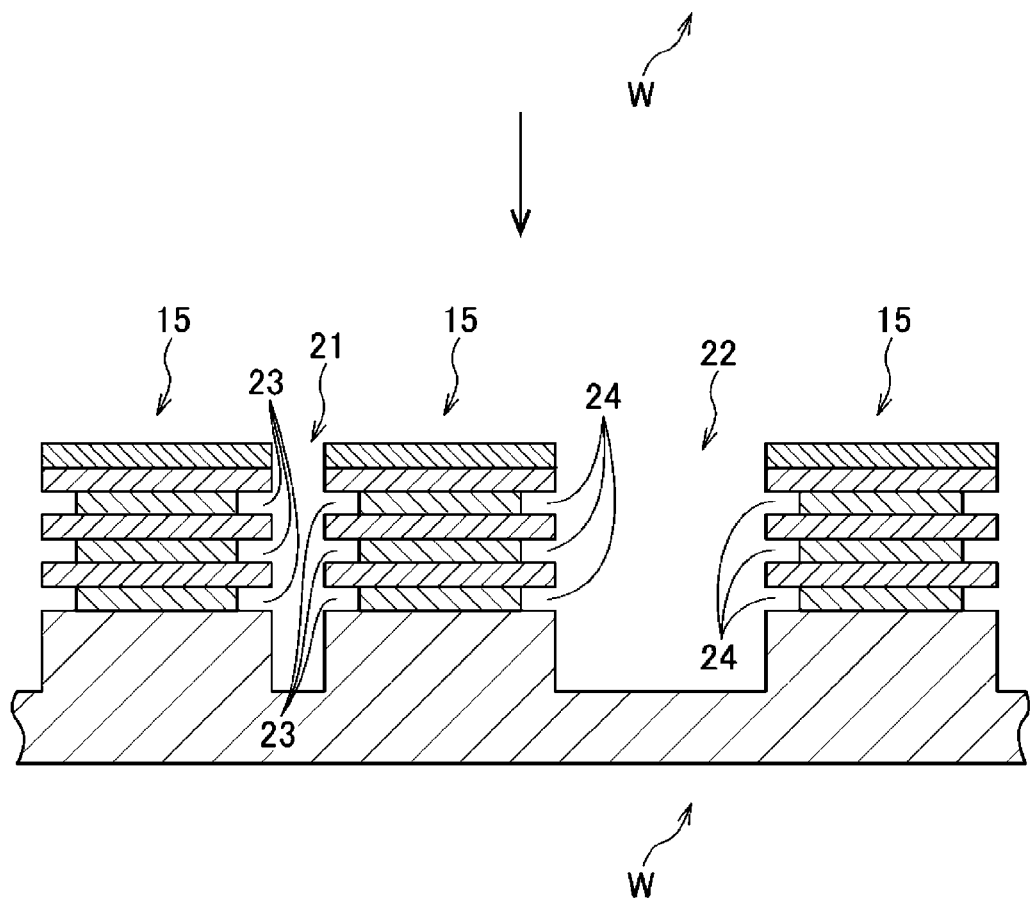

FIG. 8
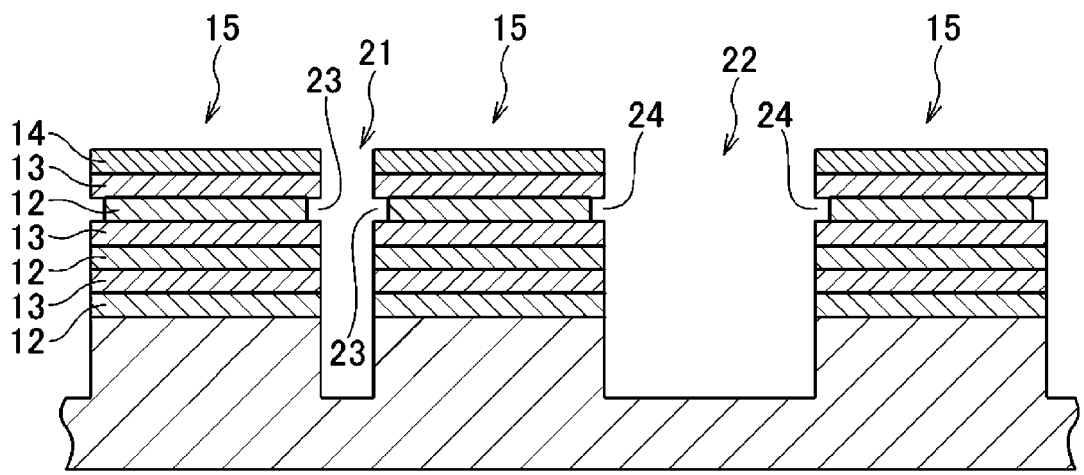
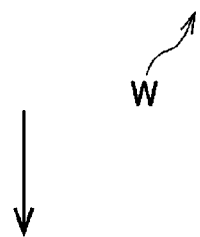
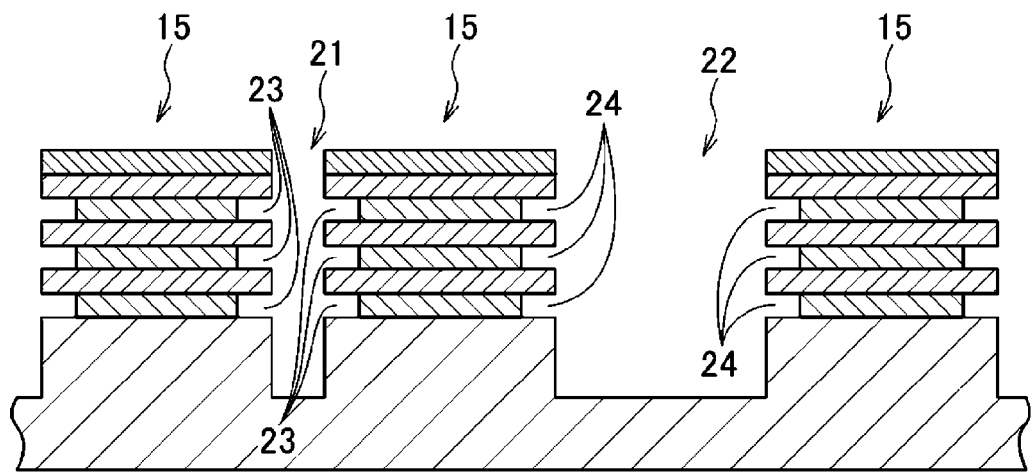

ETCHING METHOD AND ETCHING APPARATUS

CROSS-REFERENCE TO RELATED APPLICATION

This application is based upon and claims the benefit of priority from Japanese Patent Application No. 2021-099662, filed on Jun. 15, 2021, the entire contents of which are incorporated herein by reference.

TECHNICAL FIELD

The present disclosure relates to an etching method and an etching apparatus.

BACKGROUND

In manufacturing a semiconductor device, each film formed on the surface of a semiconductor wafer (hereinafter referred to as a wafer) as a substrate is etched. Patent Document 1 discloses supplying a $ClF_3$ gas and a HF gas to a wafer on which Si films and SiGe films as silicon-containing films are alternately stacked, and selectively etching the SiGe films while suppressing damage to the Si films. In addition, Patent Document 2 discloses alternately supplying a $ClF_3$ gas and a mixed gas composed of a $F_2$ gas and a $NH_3$ gas, and etching a Si film embedded in a hole of an oxide film on the surface of a wafer so that a surface roughness after the etching is reduced.

PRIOR ART DOCUMENT

Patent Document

Patent Document 1: Japanese Laid-Open Patent Publication No. 2020-053448
Patent Document 2: Japanese Laid-Open Patent Publication No. 2012-201102

SUMMARY

According to one embodiment of the present disclosure, there is provided an etching method including: accommodating a substrate having a recess formed by a sidewall, which is a germanium-containing film, into a processing container; etching the sidewall by supplying an etching gas including a first fluorine-containing gas and a second fluorine-containing gas into the processing container; and controlling a shape of the sidewall after etching by, in the etching the sidewall, adjusting a partial pressure of the first fluorine-containing gas in the processing container, or a ratio of a flow rate of the second fluorine-containing gas to a flow rate of the first fluorine-containing gas supplied into the processing container.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

FIG. 5 is a vertical sectional side view of the wafer.

FIG. 6 is a vertical sectional side view of the wafer.

FIG. 8 is a vertical sectional side view of the wafer.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
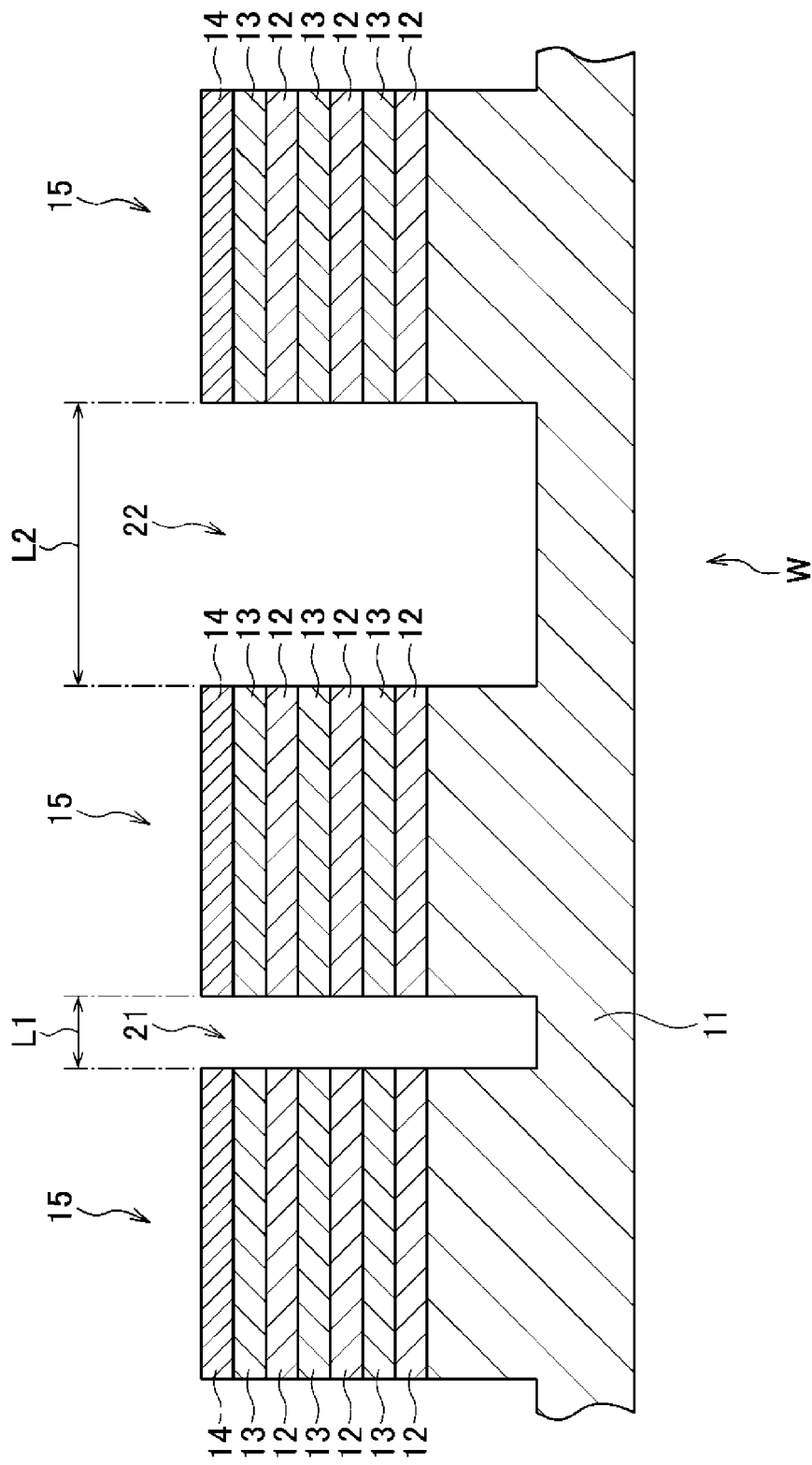
FIG. 1 is a vertical sectional side view of a wafer on which a process according to an embodiment of the present disclosure is performed.

In order to explain a process according to an embodiment of an etching method of the present disclosure, a wafer W to be etched will be described with reference to FIG. 1. FIG. 1 is a vertical sectional side view of a surface of the wafer W. In FIG. 1, reference numeral 11 designates a base constituting the wafer W, which is made of Si (silicon). A SiGe (silicon germanium) film 12 and a Si (silicon) film 13 are alternately and repeatedly stacked in the vertical direction (thickness direction of the wafer W) on the base 11. This stacked structure is formed by a large number of SiGe films 12 and a large number of Si films 13. In FIG. 1, the number of layers is omitted in order to avoid complication. The stacked structure is composed of three layers of SiGe films 12 and three layers of Si films 13. A mask film 14 is formed on the Si film 13 in the uppermost layer of this stacked structure. The mask film 14 serves as a mask for the stacked structure at the time of etching. In such a configuration, the Si film 13 which is an interposing film is interposed between the SiGe films 12 in the thickness direction of the wafer W.

A plurality of recesses is formed on the surface of the wafer W. Each recess is formed so as to have a depth extending from the surface of the mask film 14 to a surface layer of the base 11. Therefore, the sidewall of each recess is formed by the stacked body (referred to as stacked body 15) composed of the SiGe films 12, the Si films 13, the mask film 14 and the surface layer of the base 11. Thus, it can be seen that a plurality of stacked bodies 15 is arranged on the surface of the wafer W at intervals from each other. The recesses are formed so as to form a region (DENSE) in which the stacked bodies 15 are relatively dense and a region (ISO) in which the stacked bodies 15 are relatively largely separated from each other. Therefore, the recesses include a first recess 21 having a first width L1 and a second recess 22 having a second width L2 larger than the first width L1.

A difference in size between the first width L1 and the second width L2 is not unavoidably or involuntarily generated due to a processing error or the like but is generated by design. For example, a ratio of the width L2 to the width L1 in the design is 2 or more. Further, the first recess 21 and the second recess 22 illustrated in FIG. 1 are grooves extending in the front-back direction of the drawing sheet. However, the first recess 21 and the second recess 22 may be holes. In the case of holes, the first width L1 and the second width L2 are the diameters of the holes.

Figure 2:
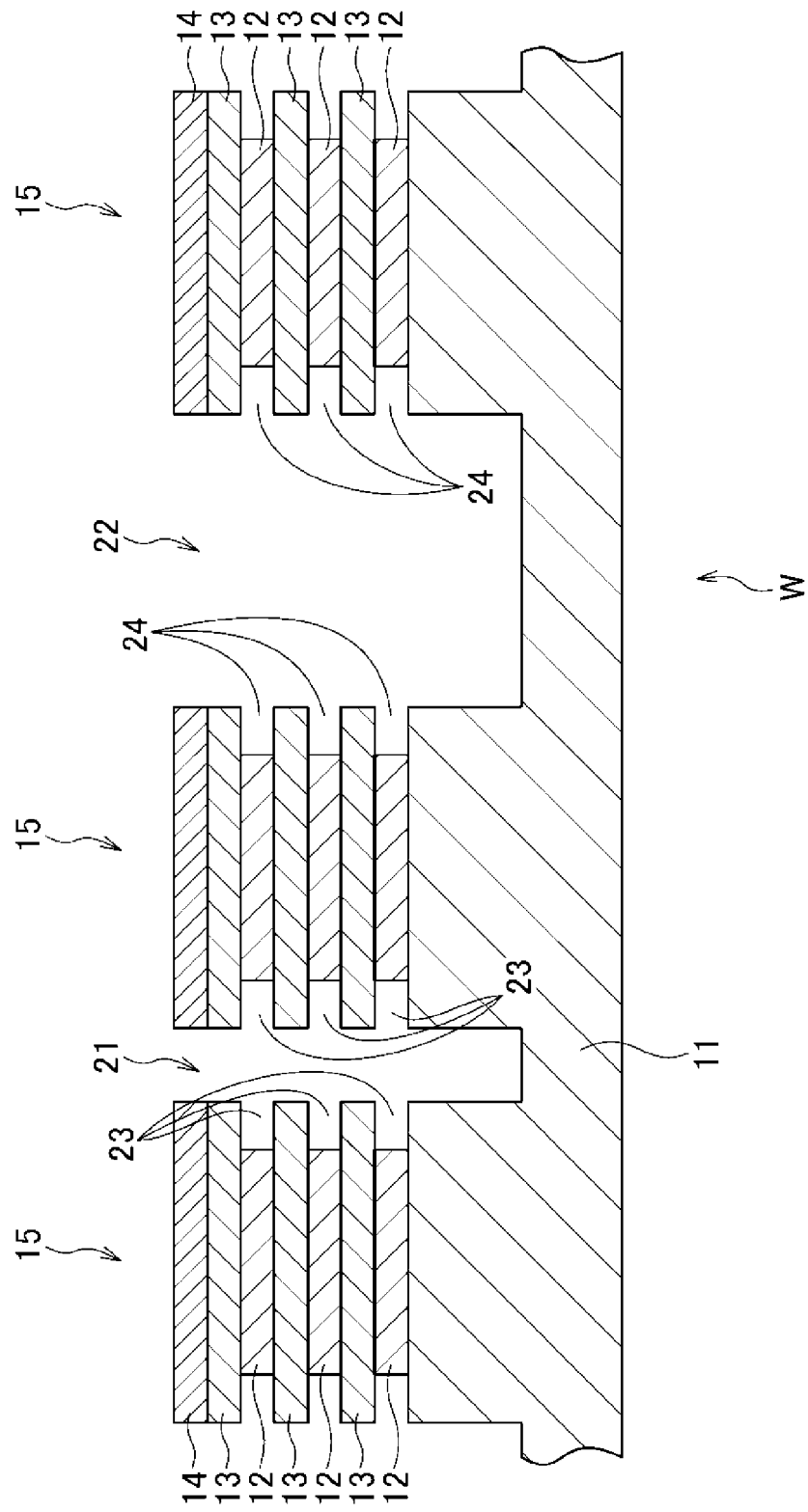
FIG. 2 is a vertical sectional side view of the wafer after etching.

The SiGe film 12 is a germanium-containing film to be etched. In the SiGe film 12, a portion facing the first recess 21 forms a first sidewall, and a portion facing the second recess 22 forms a second sidewall. In the present embodiment, the wafer W is accommodated in the processing container. A $F_2$ (fluorine) gas and a $ClF_3$ (chlorine trifluoride) gas are simultaneously supplied as etching gases into the processing container. These etching gases enter the first recess 21 and the second recess 22 to etch the SiGe film 12 of each stage constituting the stacked body 15 from the lateral side as shown in FIG. 2. Since this etching is performed to remove only a portion of the sidewall of each SiGe film 12, the SiGe film 12 of each stage remains on the wafer W after etching.

This etching selectively etches the SiGe film 12 among the SiGe film 12 and the Si film 13. Therefore, by virtue of the etching, recesses opened in the lateral direction are formed so as to face the first recess 21 and the second recess 22, respectively. Regarding the recesses, the recess facing the first recess 21 and the recess facing the second recess 22 are shown in FIG. 2 as a first lateral recess 23 and a second lateral recess 24, respectively.

In order to specifically explain the etching process of the present embodiment, an experiment performed on the etching of the wafer W will be described first. In this experiment, the SiGe film 12 was etched by setting different processing conditions for a plurality of wafers W described above. For this etching, in addition to the above-mentioned etching gases ($F_2$ gas and $ClF_3$ gas), an Ar (argon) gas and a $N_2$ (nitrogen) gas were supplied into the processing container together with the etching gas. The Ar gas and the $N_2$ gas have a role as a carrier gas for the etching gases and a role of adjusting the partial pressure of each gas in the processing container. The processing conditions changed for each wafer W are the flow rate of each gas supplied into the processing container and the pressure (total pressure) in the processing container. Along with the change of the flow rate and the total pressure, the partial pressure of the $F_2$ gas and the partial pressure of the $ClF_3$ in the processing container are also changed for each wafer W to perform the etching.

Then, in the experiment, the etching amount of the SiGe film 12 of each stage (i.e., each stage in DENSE) facing the first recess 21 and the etching amount of the SiGe film 12 of each stage (i.e., each stage in ISO) facing the second recess 22 were measured. Hereinafter, the etching amount of the portion of the SiGe film 12 facing the first recess 21 may be sometimes referred to as DENSE etching amount, and the etching amount of the portion of the SiGe film 12 facing the second recess 22 may be sometimes referred to as ISO etching amount. Further, as described above, the SiGe films 12 are provided in multiple stages in the stacked body 15. The upper SiGe film 12 may be sometimes referred to as top, the lower SiGe film 12 may be sometimes referred to as bottom, and the SiGe film 12 between the top and the bottom may be sometimes referred to as middle.

Eight processing conditions were set and are referred to as processing conditions 1 to 8. Table 1 below summarizes the processing conditions 1 to 8. The pressure inside the processing container is shown in Table 1 as the total pressure (unit: mTorr). The unit for each flow rate in Table 1 is sccm. Each partial pressure (unit: mTorr) of the $F_2$ gas and the $ClF_3$ gas in the table is a partial pressure in the processing container and is a value calculated from the flow rate of each gas and the pressure in the processing container. The temperature of the wafer W being etched under the processing conditions 1 to 8 is in the range of −40 degrees C. to 80 degrees C., which is a temperature common to each other. In order to prevent the description from becoming complicated, in the following description, the partial pressure in the processing container will be simply referred to as partial pressure, and the flow rate of the gas supplied into the processing container will be simply referred to as flow rate.

In Table 1, each setting value is replaced with a value using an alphabet, except for the partial pressure of the $ClF_3$ gas. Specifically, for the pressure (total pressure) in the processing container, a predetermined pressure value (unit: mTorr) is indicated by alphabet A and a multiplication value of A is indicated before A, thereby indicating the total pressure. Therefore, for example, the total pressure (2A) in the processing conditions 1 to 4, 6 and 8 is twice the total pressure (A) in the processing conditions 5 and 7.

The flow rates of the $F_2$ gas, the $ClF_3$ gas and the $N_2$ gas are also indicated by alphabet B to D and multiplication values of B to D just like the above-mentioned total pressure. Further, the flow rate ratio shown in Table 1 is the ratio of the flow rate of the $F_2$ gas (second fluorine-containing gas) to the flow rate of the $ClF_3$ gas (first fluorine-containing gas). The flow rate ratio is indicated by "B/C" and a multiplication value thereof in Table 1. This flow rate ratio will be hereinafter referred to as a $F_2/ClF_3$ flow rate ratio. Further, the partial pressure (unit: mTorr) of the $F_2$ gas is also indicated alphabet F and a multiplication value thereof just like the total pressure and the $F_2/ClF_3$ flow rate ratio. However, for the flow rate (unit: sccm) of the Ar gas, the value thereof has a small difference between the processing conditions. Therefore, unlike the indications of other gases in the table, the flow rate of the Ar gas is not indicated by a multiplication value. E1 to E8 indicated as the flow rates of the Ar gas in the table are individual values.

TABLE 1

| Processing condition | Total Pressure | $F_2$ flow rate | $ClF_3$ flow rate | $N_2$ flow rate | Ar flow rate | Flow rate ratio ($F_2/ClF_3$) | $F_2$ Partial pressure | $ClF_3$ Partial pressure |
|---|---|---|---|---|---|---|---|---|
| 1 | 2A | 2B | C | 2D | E1 | 2B/C | 2F | 0.7 |
| 2 | 2A | 2B | 0.5C | 2D | E2 | 4B/C | 2F | 0.4 |
| 3 | 2A | B | C | 2D | E3 | B/C | F | 0.7 |
| 4 | 2A | B | 0.5C | 2D | E4 | 2B/C | F | 0.4 |
| 5 | A | B | 0.33C | D | E5 | 3B/C | F | 0.2 |
| 6 | 2A | 3B | 0.5C | 2D | E6 | 6B/C | 3F | 0.4 |
| 7 | A | 3B | 0.33C | D | E7 | 9B/C | 2F | 0.2 |
| 8 | 2A | 1.5B | 0.5C | 2D | E8 | 3B/C | 1.5F | 0.4 |

B/C = 24.46

Figure 3:
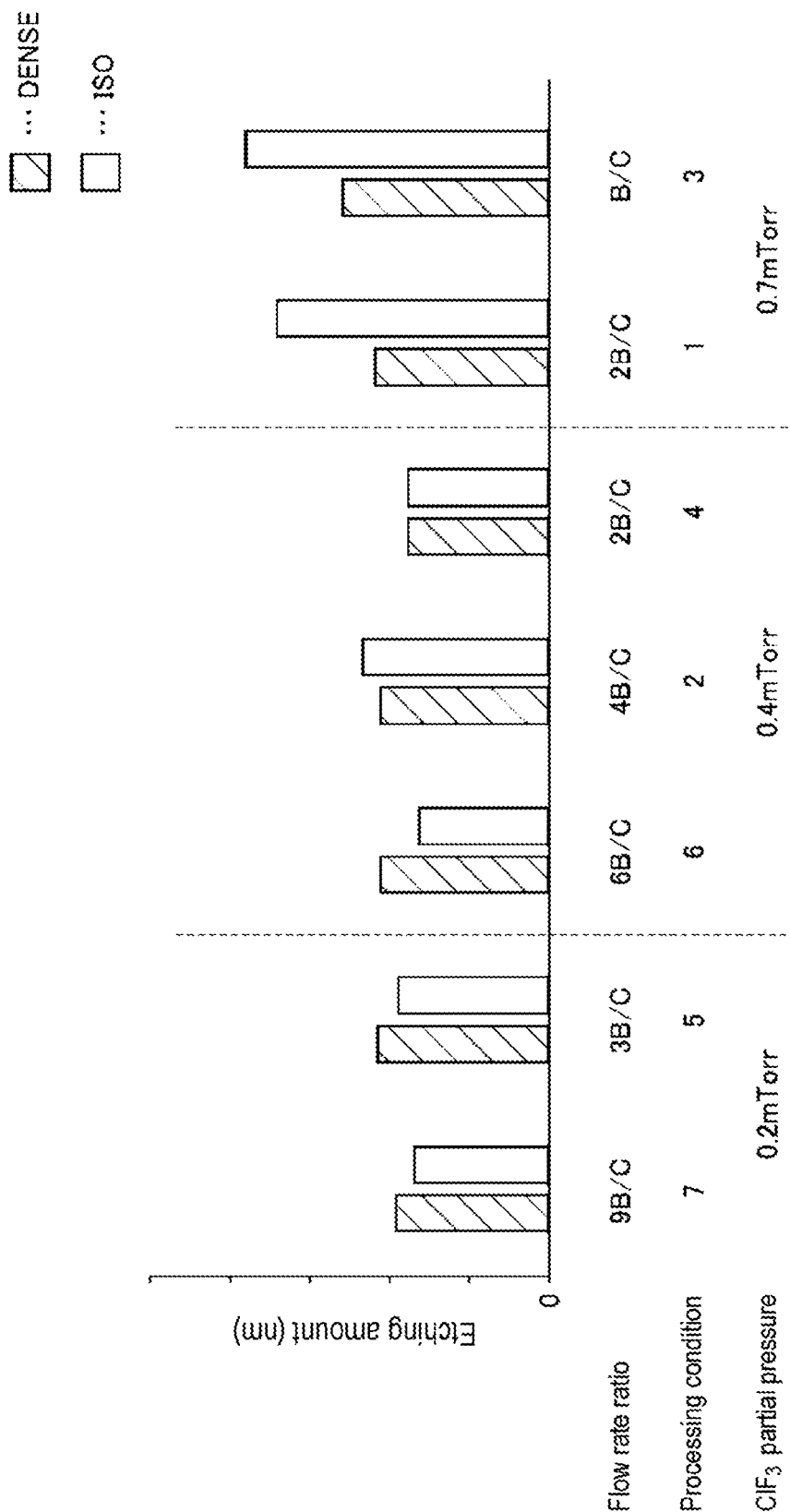
FIG. 3 is a graph showing experimental results.

FIG. 3 is a bar graph showing the DENSE etching amount and the ISO etching amount for each processing condition as experimental results. The vertical axis of the graph is graduated in increments of a predetermined etching amount. Therefore, the etching amounts between the graduations indicate the same amount. The bars showing the DENSE etching amount are indicated with hatching, and the bars showing the ISO etching amount are indicated without hatching. Each etching amount indicated by a bar in FIG. 3 is an average value of the top, middle and bottom etching amounts described above.

Then, in FIG. 3, bars are indicated in the order of the processing conditions 7, 5, 6, 2, 4, 1 and 3 from the left side to the right side. The partial pressure of the $ClF_3$ gas is 0.2 mTorr ($0.267 \times 10^{-1}$ Pa) under the processing conditions 5 and 7, 0.4 mTorr ($0.533 \times 10^{-1}$ Pa) under the processing conditions 2, 4 and 6, and 0.7 mTorr ($0.933 \times 10^4$ Pa) under the processing conditions 1 and 3. Therefore, FIG. 3 indicates the bars for the respective processing conditions according to the partial pressure of the $ClF_3$ gas. As for the processing conditions in which the partial pressure of the $ClF_3$ gas is the same, there are arranged bars for the processing conditions in which the $F_2/ClF_3$ flow rate ratio decreases toward the right side in FIG. 3. Therefore, the respective processing conditions are arranged in the above order.

As shown in FIG. 3, in the processing conditions 1 and 3 in which the partial pressure of the $ClF_3$ gas is 0.7 mTorr, the ISO etching amount is larger than the DENSE etching amount. Further, in the processing conditions 5 and 7 in which the partial pressure of the $ClF_3$ gas is 0.2 mTorr, the DENSE etching amount is larger than the ISO etching amount. Therefore, the experimental results indicate that when the partial pressure of the $ClF_3$ gas is relatively large, the ISO etching amount is larger than the DENSE etching amount regardless of the $F_2/ClF_3$ flow rate ratio, and when the partial pressure of the $ClF_3$ gas is relatively small, the DENSE etching amount is larger than the ISO etching amount regardless of the $F_2/ClF_3$ flow rate ratio.

Looking at the processing conditions 2, 4 and 6 in which the partial pressure of the $ClF_3$ gas is 0.4 mTorr, the DENSE etching amount and the ISO etching amount are almost equal to each other in the processing condition 4 having the smallest $F_2/ClF_3$ flow rate ratio among the processing conditions 2, 4 and 6. Among the processing conditions 2, 4 and 6, in the processing condition 2 in which the $F_2/ClF_3$ flow rate ratio is smaller than that of the processing condition 4, the ISO etching amount is larger than the DENSE etching amount. In the processing condition 6, the DENSE etching amount is larger than the ISO etching amount.

As described above, it can be seen that the DENSE etching amount and the ISO etching amount are changed according to the partial pressure of the $ClF_3$ gas, and the magnitude relationship between the DENSE etching amount and the ISO etching amount is changed according to the partial pressure of the $ClF_3$ gas. Specifically, it can be seen that the DENSE etching amount and the ISO etching amount may be changed according to the partial pressure of the $ClF_3$ gas so that they are equal or substantially equal to each other, or one of them is larger than the other.

The $ClF_3$ gas has higher reactivity with the SiGe film 12 than the $F_2$ gas. When the partial pressure of the $ClF_3$ gas is relatively small, the concentration of the $ClF_3$ gas in the relatively-large second recess 22 becomes very low so that the reaction between the $ClF_3$ gas and the SiGe film 12 is unlikely to occur. On the other hand, when the partial pressure of the $ClF_3$ gas is relatively large, the concentration of the $ClF_3$ gas in the second recess 22 becomes relatively high so that the $ClF_3$ gas and the SiGe film 12 can efficiently react with each other. That is, it is considered that when the partial pressure of the $ClF_3$ gas is larger than 0.7 mTorr, the ISO etching amount becomes larger than the DENSE etching amount as in the processing conditions 1 and 3 in which the partial pressure of the $ClF_3$ gas is 0.7 mTorr, and when the partial pressure of the $ClF_3$ gas is smaller than 0.3 mTorr, the DENSE etching amount becomes larger than the ISO etching amount as in the processing conditions 5 and 7 in which the partial pressure of the $ClF_3$ gas is 0.3 mTorr. In summary, the ISO etching amount becomes larger than the DENSE etching amount by performing the processing within a range (second range) where the partial pressure of the $ClF_3$ gas is 0.7 mTorr or more, and the DENSE etching amount becomes larger than the ISO etching amount by performing the processing within a range (third range) where the partial pressure of the $ClF_3$ gas is 0.2 mTorr or less. As can be noted from the above experimental results, in the processing performed within the range (the first range) where the partial pressure of the $ClF_3$ gas is larger than 0.2 mTorr and smaller than 0.7 mTorr, the DENSE etching amount and the ISO etching amount are changed according to the $F_2/ClF_3$ flow rate ratio. As a result, the magnitude relationship between the DENSE etching amount and the ISO etching amount is changed.

Figure 4:
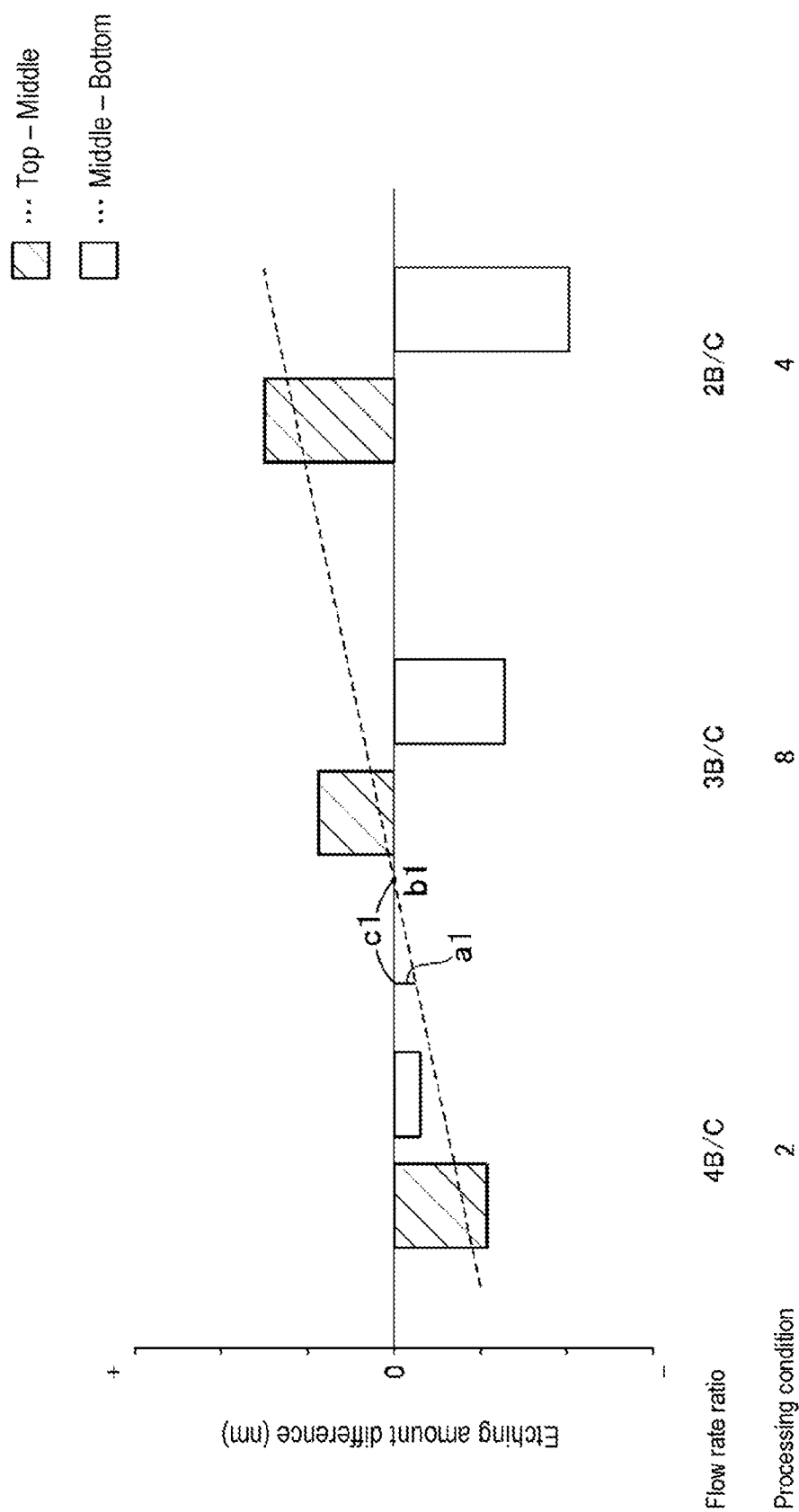
FIG. 4 is a graph showing experimental results.

Further, in the above-described experiment, the relationship between the etching amounts at the top, middle and bottom is acquired from each of the wafers W processed under the processing conditions 2, 4 and 8 in which the partial pressure of the $ClF_3$ gas is 0.4 mTorr which is a value within the first range. FIG. 4 is a bar graph showing the relationship between the etching amounts. The vertical axis of the graph shown in FIG. 4 is graduated in increments of a difference between predetermined etching amounts. Therefore, the differences between the etching amounts remain the same between the graduations. In FIG. 4, the etching amount at top—the etching amount at the middle is indicated by bars with hatching, and the etching amount at middle—the etching amount at the bottom is indicated by bars without hatching. As the bars go to the right, the $F_2/ClF_3$ flow rate ratio for the processing conditions becomes small. Therefore, the bars are arranged toward the right side in the order of the processing conditions 2, 8 and 4.

As shown in FIG. 4, regarding the middle etching amount and the bottom etching amount, the bottom etching amount is larger than the middle etching amount in all of the processing conditions 2, 4 and 8. The difference between the middle etching amount and the bottom etching amount becomes small in the order of the processing conditions 4, 8 and 2 and is quite small in the processing condition 2. The $F_2/ClF_3$ flow rate ratios of the processing conditions 2, 8 and 4 are 4B/C, 3B/C and 2B/C, respectively. Therefore, it can be seen that, in the range of the $F_2/ClF_3$ flow rate ratio of 2B/C to 4B/C, the larger the $F_2/ClF_3$ flow rate ratio, the smaller the difference between the middle etching amount and the bottom etching amount.

Looking at the difference between the top etching amount and the middle etching amount, the difference is a positive value in the processing conditions 4 and 8. Therefore, the top etching amount is larger than the middle etching amount. The difference between the top etching amount and the middle etching amount is smaller in the processing condition 8 than in the processing condition 4. In the processing condition 2, the difference between the top etching amount and the middle etching amount is a negative value, and the middle etching amount is larger than that of the top etching amount. As described above, it can be seen that, in the range of the $F_2/ClF_3$ flow rate ratio of 2B/C to 4B/C, the larger the $F_2/ClF_3$ flow rate ratio, the larger the middle etching amount with respect to the bottom etching amount. The absolute value of the difference in the etching amount is close between the processing condition 2 and the processing condition 8.

As described above, when the partial pressure of the $ClF_3$ gas is within the above-mentioned first range, the etching amount at each of the top, middle and bottom can be adjusted by changing the above-mentioned $F_2/ClF_3$ flow rate ratio for the SiGe film 12 facing each of the first recess 21 and the second recess 22. It is presumed that, in the range of the $F_2/ClF_3$ flow rate ratio larger than 3B/C and smaller than 4B/C, there is a preferred value at which the difference between the top etching amount and the middle etching amount can be made zero or substantially zero and at which the difference between the middle etching amount and the bottom etching amount can be made extremely small. As shown in Table 1, B/C=24.46. Therefore, in order to make the top, middle and bottom etching amounts uniform, the $F_2/ClF_3$ flow rate ratio is preferably set to be larger than 3×24.46=73.38 and smaller than 4×24.46=97.84. The dotted line and a1, b1 and c1 in the graph of FIG. 4 will be described later as an example of setting $F_2/ClF_3$ using this experiment.

The etching process of the present embodiment is performed based on the findings obtained in the above-described experiments. Specifically, the shape of the surface of the wafer W after etching is controlled to obtain a desired shape. Hereinafter, some specific examples of this shape control will be described. In each of these specific examples, it is an object to perform etching so that the shapes of the stacked bodies 15 after etching are the same or substantially the same. In other words, the stacked bodies 15 are etched so as to have a symmetrical shape in the left-right direction.

First, a first specific example will be described. It is assumed that in the wafer W as an etching target transferred into the processing container, as shown in FIG. 1, the lateral positions of the sidewall of the SiGe film 12 and the sidewall of the Si film 13 in each stacked body 15 are aligned with each other. In this case, etching is performed by, for example, setting the partial pressure of the $ClF_3$ gas to 0.4 mTorr, which is the same as the partial pressure of the $ClF_3$ gas in the processing conditions 2, 4, 6 and 8, and setting the $F_2/ClF_3$ flow rate ratio to a reference value. The reference value of the $F_2/ClF_3$ flow rate ratio is, for example, a value falling within a range larger than 3B/C and smaller than 4B/C described in the graph of FIG. 4. That is, this reference value is a value close to the $F_2/ClF_3$ flow rate ratio of the processing condition 4 in which the ISO etching amount and the DENSE etching amount are substantially the same (see FIG. 3). Therefore, the ISO etching amount and the DENSE etching amount can be set to substantially the same value by performing the etching with this reference value.

Therefore, after etching, as shown in FIG. 2, the depth of the first lateral recess 23 and the depth of the second lateral recess 24 can be made equal to each other, and the shapes of the stacked bodies 15 can be made the same or substantially the same. Further, as described with reference to FIG. 4, the $F_2/ClF_3$ flow rate ratio is set as described above. Therefore, the top, middle and bottom etching amounts have the same value. That is, the uniformity of the depths of the first lateral recesses 23 at the top, middle and bottom and the uniformity of the depths of the second lateral recesses 24 at the top, middle and bottom are improved.

Next, a second specific example will be described. The wafer W before an etching process in this example is shown in the upper part of FIG. 5. This wafer W has substantially the same configuration as the wafer W shown in FIG. 1. However, in the pre-etching process, the side of each SiGe film 12 facing the first recess 21 (DENSE side) is etched, and a first lateral recess 23 is formed in advance. The lateral positions of the sidewalls of the Si film 13 and the sidewalls of the SiGe film 12 facing the first recess 21 are not aligned.

Therefore, in order to make the shapes of the stacked bodies 15 uniform by etching the wafer W in the upper part of FIG. 5, it is necessary to increase the ISO etching amount as compared with the DENSE etching amount. Therefore, the partial pressure of the $ClF_3$ gas is set to 0.4 mTorr, and the $F_2/ClF_3$ flow rate ratio is set to be lower than the reference value. As an example, etching is performed by setting the $F_2/ClF_3$ flow rate ratio to 4B which is the same value as in the processing condition 2 described with reference to FIG. 3. By performing such etching, the ISO etching amount becomes larger than the DENSE etching amount. The lower part of FIG. 5 shows the wafer W after etching. Due to the difference in the etching amount, the depths of the first lateral recesses 23 and the depths of the second lateral recesses 24 are made equal to each other as shown in the lower part of FIG. 5. The shapes of the stacked bodies 15 after etching are the same or almost the same.

Subsequently, a third specific example will be described. The wafer W before an etching process in this example is shown in the upper part of FIG. 6. This wafer W has substantially the same configuration as the wafer W shown in FIG. 1. However, in the pre-etching process, the side of each SiGe film 12 facing the second recess 22 (ISO side) is etched, and a second lateral recess 24 is formed in advance. Therefore, the lateral positions of the sidewalls of the Si films 13 and the sidewalls of the SiGe films 12 facing the second recess 22 are not aligned.

Therefore, in order to make the shapes of the stacked bodies 15 uniform by etching the wafer W in the upper part of FIG. 6, it is necessary to increase the DENSE etching amount as compared with the ISO etching amount. Therefore, the partial pressure of the $ClF_3$ gas is set to 0.4 mTorr, and the $F_2/ClF_3$ flow rate ratio is set to be higher than the reference value. As an example, etching is performed by setting the $F_2/ClF_3$ flow rate ratio to 6B/C which is the same value as that of the processing condition 6 described with reference to FIG. 3. By performing such etching, the DENSE etching amount becomes larger than the ISO etching amount. The lower part of FIG. 6 shows the wafer W after etching. Due to the difference in the etching amount, the depths of the first lateral recesses 23 and the depths of the second lateral recesses 24 are made equal to each other as shown in the lower part of FIG. 6. The shapes of the stacked bodies 15 after etching are the same or almost the same.

A fourth specific example will be described. The wafer W before an etching process in this example is shown in the upper part of FIG. 7. This wafer W has substantially the same configuration as the wafer W shown in FIG. 1. However, in the pre-etching process, the positions of the sidewalls of the SiGe films 12 of each stage facing the first recess 21 and the second recess 22 are uneven. The SiGe films 12 are etched more at the middle than at the top and bottom to form the first lateral recess 23 and the second lateral recess 24. At the top and bottom, the SiGe films 12 are not substantially etched.

Therefore, etching is performed by setting the partial pressure of the $ClF_3$ gas to 0.4 mTorr and setting the $F_2/ClF_3$ flow rate ratio to a value lower than the reference value. In such setting, as shown in FIG. 4, the top and the bottom etching amounts become larger than the middle etching amount as compared with the case in which the etching is performed with the reference value. Accordingly, as shown in the lower part of FIG. 7, the depths of the first lateral recesses 23 of each stage and the depths of the second lateral recesses 24 of each stage can be made uniform for the wafer W after etching.

A fifth specific example will be described. In this example, as in the fourth specific example, for the wafer W before an etching process, the positions of the sidewalls of the SiGe films 12 of each stage facing the first recess 21 and the second recess 22 are uneven in a pre-etching process. Specifically, as shown in the upper part of FIG. 8, the top SiGe films 12 are etched larger than the middle and the bottom SiGe films 12 to form first lateral recesses 23 and second lateral recesses 24. The middle and the bottom SiGe films 12 are not substantially etched.

In that case, etching is performed by setting the partial pressure of the $ClF_3$ gas to 0.4 mTorr and setting the $F_2/ClF_3$ flow rate ratio to a value higher than the reference value. In such setting, as shown in FIG. 4, the middle etching amount becomes larger than the top etching amount as compared with the case in which the etching is performed with the reference value. Further, the difference between the middle etching amount and the bottom etching amount becomes small. Thus, the depths of the first lateral recesses 23 of each stage and the depths of the second lateral recesses 24 of each stage can be made uniform for the wafer W after etching. Regarding fourth and fifth specific examples shown in FIGS. 7 and 8, the $F_2/ClF_3$ flow rate ratio is set to a value smaller than, for example, 4B/C of the processing condition 2. That is, the $F_2/ClF_3$ flow rate ratio is set to a value close to the $F_2/ClF_3$ flow rate ratio of the processing condition 4 in which the DENSE etching amount and the ISO etching amount are substantially the same, so that the DENSE etching amount and the ISO etching amount are equal to each other.

As described above, in the first to fifth specific examples, the partial pressure of the $ClF_3$ in the processing container is set to 0.4 mTorr, and then the $F_2/ClF_3$ flow rate ratio is set according to the wafer W transferred into the processing container. As a result, it is possible to control the stacked bodies 15 after etching so as to suppress variations in the shape of each wafer W.

Regarding the above-described first to fifth specific examples, the partial pressure of the $ClF_3$ gas is not limited to 0.4 mTorr. The shape of the wafer W after etching may be controlled by setting the partial pressure of the $ClF_3$ gas to another value within the first range and then changing the $F_2/ClF^3$ flow rate ratio in the similar manner. Further, the reference value of the flow rate ratio is not limited to the value described above. For example, the reference value of the flow rate ratio may be set to 4B/C which is the same value as that of the processing condition 4. The etching process may be performed by changing the reference value depending on the shape of the wafer W as described with reference to FIGS. 5 to 8.

Subsequently, a sixth specific example will be described. In the sixth specific example, the wafer W shown in the upper part of FIG. 5 described in the second specific example is etched. The processing is performed by setting the partial pressure to a value within the range of 0.7 mTorr or more (within the second range). As described in FIG. 3, by setting the partial pressure in this way, the ISO etching amount becomes larger than the DENSE etching amount. As shown in the lower part of FIG. 5, the shapes of the stacked bodies 15 after etching are the same or almost the same. The $F_2/ClF_3$ flow rate ratio may be set to an arbitrary value. Since it has been confirmed that the DENSE etching amount is smaller than the ISO etching amount when the $F_2/ClF_3$ flow rate ratio is B/C and 2B/C in the processing conditions 1 and 3, the $F_2/ClF_3$ flow rate ratio may be set to, for example, a value in the range of B/C to 2B/C.

Next, a seventh specific example will be described. In the seventh specific example, the wafer W shown in the upper part of FIG. 6 described in the third specific example is etched. The processing is performed by setting the partial pressure to a value within the range of 0.2 mTorr or less (within the third range). As described in FIG. 3, by setting the partial pressure in this way, the DENSE etching amount becomes larger than the ISO etching amount. The shapes of the stacked bodies 15 after etching are the same or almost the same. The $F_2/ClF_3$ flow rate ratio may be set to an arbitrary value. Since it has been confirmed that the DENSE etching amount is larger than the ISO etching amount when the $F_2/ClF_3$ flow rate ratio is 3B/C and 9B/C in the processing conditions 5 and 7, the $F_2/ClF_3$ flow rate ratio may be set to, for example, a value in the range of 3B/C to 9B/C.

As described above, in the above-described first to third specific examples, the ISO etching amount (etching amount of the first sidewall) and the DENSE etching amount (etching amount of the second sidewall) are controlled by adjusting the $F_2/ClF_3$ flow rate ratio, thereby controlling the magnitude relationship of these etching amounts. However, the ISO etching amount and the DENSE etching amount can be controlled by adjusting the partial pressure of the $ClF_3$ gas as in the sixth and seventh specific examples, thereby controlling the magnitude relationship thereof. In the processing of each specific example described above, the temperature of the wafer W is set to a temperature within the range described above.

Figure 9:
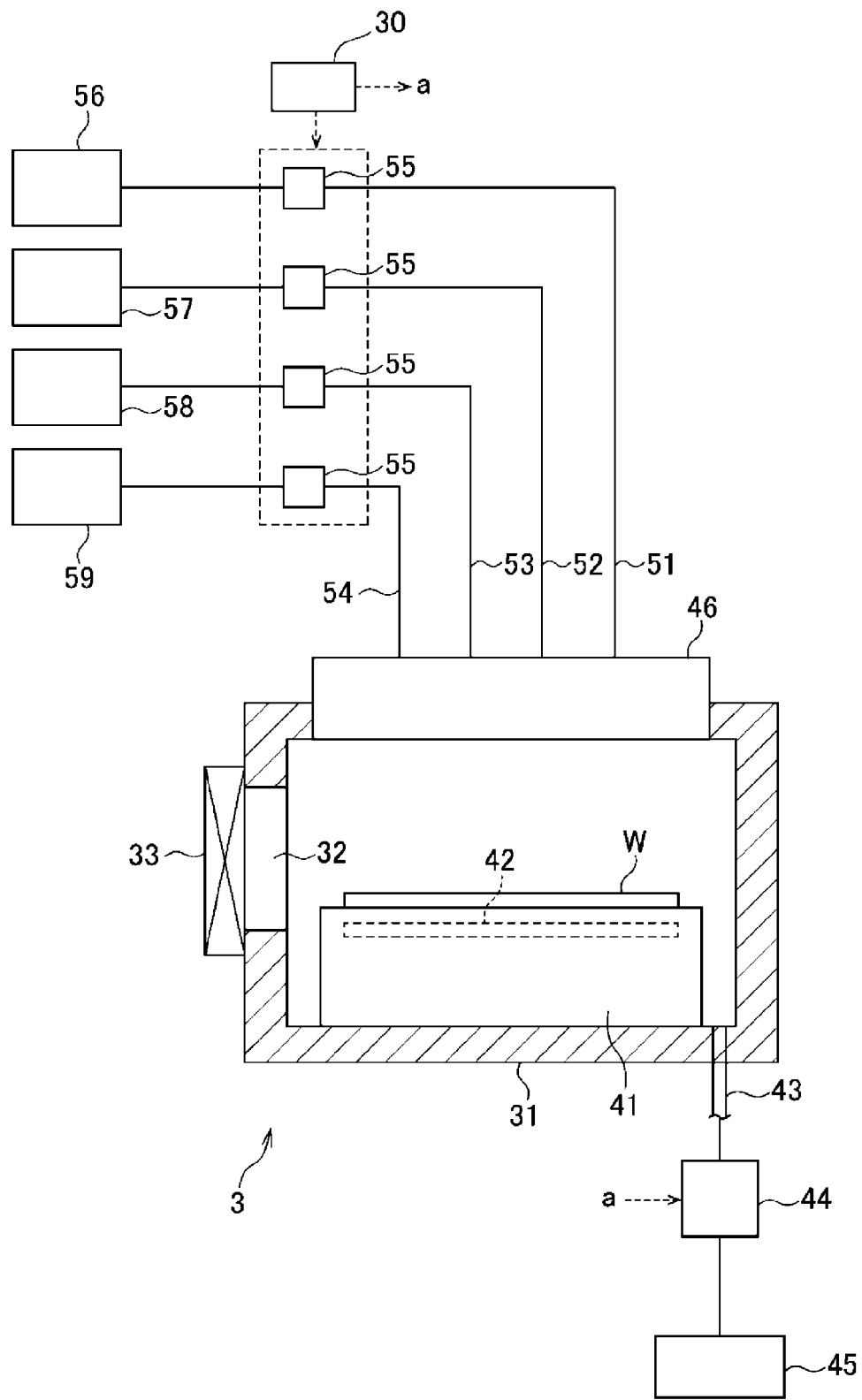
FIG. 9 is a vertical sectional side view of an etching apparatus.

Next, an etching apparatus 3 will be described with reference to the vertical sectional side view of FIG. 9. The etching apparatus 3 can select and execute any one of the specific examples for one wafer W. The etching apparatus 3 includes a processing container 31. Reference numeral 32 in FIG. 9 designates a transfer port for the wafer W opened in the sidewall of the processing container 31. The transfer port 32 is opened and closed by a gate valve 33. A stage 41 on which the wafer W is placed is provided in the processing container 31. Lift pins (not shown) are provided in the stage 41. The wafer W is delivered between the substrate transfer mechanism (not shown) and the stage 41 via the lift pins.

A temperature adjustment part 42 is embedded in the stage 41, and the temperature of the wafer W placed on the stage 41 is kept within the range described above. The temperature adjustment part 42 is configured as a flow path that forms a portion of a circulation path through which a fluid for temperature adjustment such as water or the like flows. The temperature of the wafer W is adjusted by heat exchange with the fluid. However, the temperature adjustment part 42 is not limited to the fluid flow path of such a fluid and may be configured by, for example, a heater which is a resistance heating body.

Further, one end of an exhaust pipe 43 is opened in the processing container 31, and the other end of the exhaust pipe 43 is connected to an exhaust mechanism 45 configured by, for example, a vacuum pump via a valve 44 which is a pressure changing mechanism. The total pressure in the processing container 31 is changed as the exhaust flow rate is changed by changing the opening degree of the valve 44.

A gas shower head 46, which is an etching gas supplier, is provided on the upper side of the processing container 31 so as to face the stage 41. The downstream sides of gas supply paths 51 to 54 are connected to the gas shower head 46, and the upstream sides of the gas supply paths 51 to 54 are connected to gas sources 56 to 59 via flow rate adjustment parts 55, respectively. Each flow rate adjustment part 55 includes a valve and a mass flow controller. Therefore, the flow rates of the gases supplied from the gas sources 56 to 59 to the downstream sides are adjusted by the flow rate adjustment parts 55.

An $F_2$ gas, a $ClF_3$ gas, an Ar gas, and a $N_2$ gas are supplied from the gas sources 56, 57, 58, and 59, respectively. Therefore, the $F_2$ gas, the $ClF_3$ gas, the Ar gas, and the $N_2$ gas can be supplied from the gas shower head 46 into the processing container 31. With the above configuration, the $F_2/ClF_3$ flow rate ratio can be adjusted by the operation of the flow rate adjustment parts 55 installed in the gas supply paths 51 and 52, respectively, and the partial pressure of the $ClF_3$ gas in the processing container 31 can be adjusted by the operation of the flow rate adjustment part 55 installed in the gas supply path 52 and the operation of the valve 44 installed in the exhaust pipe 43. That is, the $F_2/ClF_3$ flow rate ratio and the partial pressure of the $ClF_3$ gas in the processing container 31 can be set to the values of the above-described process examples, and each processing can be carried out. The flow rate adjustment part 55 and the valve 44 are configured as an adjustment part.

As shown in FIG. 4, the etching apparatus 3 includes a controller 30 which is a computer. The controller 30 includes a program, a memory, and a CPU. The program incorporates instructions (respective steps) so that the processes described in the specific examples are performed. The program is stored in a non-transitory computer-readable storage medium such as a compact disk, a hard disk, a magneto-optical disk, a DVD, or the like and is installed in the controller 30. The controller 30 outputs a control signal to each part of the etching apparatus 3 according to the program and controls the operations of the respective parts. Specifically, for example, the operations for the respective parts include an operation of adjusting the flow rate of each gas supplied to the downstream side by each flow rate adjustment part 55 described above, an operation of adjusting the opening degree of the valve 44, and the like.

The wafer W shown in FIG. 1 or the like is transferred into the processing container 31 of the etching apparatus 3 and is placed on the stage 41. The temperature of the wafer W is preferably adjusted to −40 degrees C. to 20 degrees C. Then, in a state in which the inside of the processing container 31 has a desired pressure (total pressure), the $F_2$ gas, the $ClF_3$ gas, the Ar gas and the Na gas are supplied into the processing container 31 to perform an etching process. The partial pressure of each gas and the $F_2/ClF_3$ flow rate ratio are set to desired values as described above.

Depending on the wafer W transferred into the processing container 31, the user of the etching apparatus 3 may manually set the $F_2/ClF_3$ flow rate ratio and the partial pressure of the $ClF_3$ gas in the processing container 31. However, the controller 30 may automatically set these parameters. Specifically, for example, a controller provided in an apparatus for performing a pre-etching process transmits information for specifying the shape of the wafer W to be transferred to the etching apparatus 3 to the controller 30 described above. More specifically, for example, the shape of the wafer W shown in FIG. 2, the shape of the wafer W shown in the upper part of FIG. 5, and the shape of the wafer W shown in the upper part of FIG. 6 are switched according to the processing recipe of another apparatus that performs a pre-etching process. In that case, information specifying the processing recipe for processing the wafer W transferred to the etching apparatus 3 is transmitted to the controller 30, and the controller 30 acquires the information.

Then, the controller 30 sets the partial pressure of the $ClF_3$ gas in the processing container 31 to a value falling within the first range, and selects and determines, as the $F_2/ClF_3$ flow rate ratio, the value described in the first specific example, the value described in the second specific example, or the value described in the third specific example, based on the above information. By performing etching with the determined value, the ISO etching amount and the DENSE etching amount are controlled as described with reference to each figure to make the shapes of the stacked bodies 15 uniform.

As described above, instead of determining the $F_2/ClF_3$ flow rate ratio based on the information from another apparatus, the partial pressure of the $ClF_3$ gas in the processing container 31 may be selected from the value in the first range, the value in the second range, and the value in the third range to control the above-described magnitude relationship. Therefore, the controller 30 may select the partial pressure of the $ClF_3$ gas to control the magnitude relationship of the etching amounts. That is, the controller 30 may determine which of the processing conditions described in the first specific example, the sixth specific example, and the seventh specific example is used for the processing.

Figure 7:
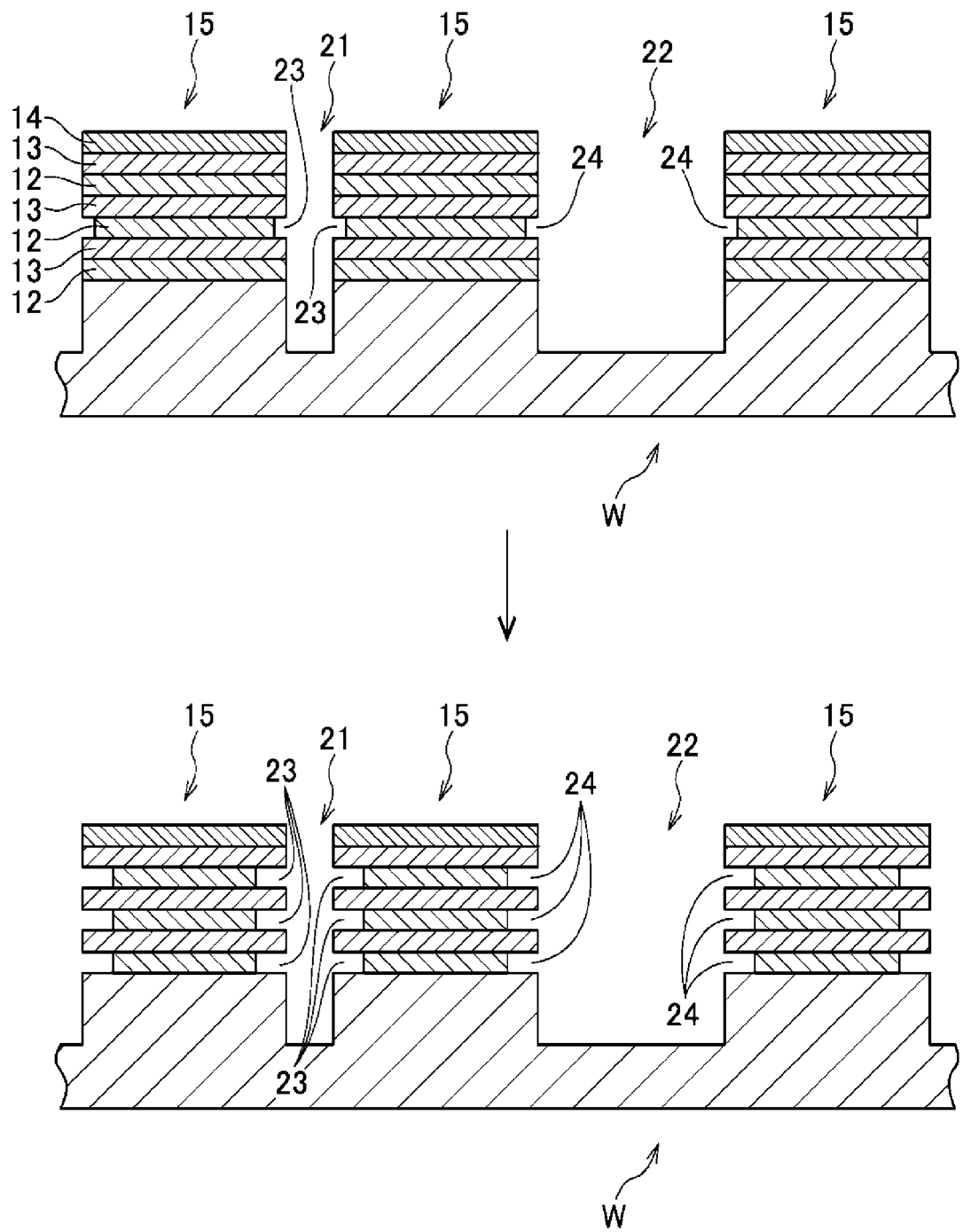
FIG. 7 is a vertical sectional side view of the wafer.

Further, for example, depending on the processing recipe of another apparatus, the etching amount of the SiGe films 12 facing the first recess 21 are changed, and the positional relationship of the top, middle and bottom sidewalls of the SiGe films 12 is changed to the positional relationship shown in FIG. 1, the positional relationship shown in FIG. 7, or the positional relationship shown in FIG. 8. By the controller 30, the partial pressure of the $ClF_3$ gas is set to a value falling within the first range, and the $F_2/ClF_3$ flow rate ratio is determined to be the above-mentioned reference value, a value larger than the reference value by a redetermined amount, or a value smaller than the reference value by a redetermined amount, based on the information on the above processing recipe. That is, the controller 30 determines which of the processing conditions described in the first specific example, the fourth specific example and the fifth specific example is used to perform processing, whereby the $F_2/ClF_3$ flow rate ratio is switched. That is, depending on the wafer W stored in the processing container 31, the $F_2/ClF_3$ flow rate ratio is adjusted, and the etching shape of the SiGe films of each stage facing the first recess 21 is controlled.

Other usage examples of the experimental results are shown. The dotted line in FIG. 4 approximately indicates the correspondence between the $F_2/ClF_3$ flow rate ratio obtained in the experiment and the top-middle etching amount as a linear function. This linear function is stored in the memory of the controller 30. Then, for example, the partial pressure of the $ClF_3$ gas is 0.4 mTorr for one wafer W, and the $F_2/ClF_3$ flow rate ratio is an arbitrary first flow rate ratio. This one wafer W is inspected to obtain a measured value a1 for the difference between the top and middle etching amounts.

Then, in the above linear function, a displacement amount c1 of the $F_2/ClF_3$ flow rate ratio between the point b1 where the difference between top and middle etching amounts becomes 0 and a point corresponding to the measured value a1 is read out. When the subsequent wafer W is processed, the flow rate ratio (referred to as second flow rate ratio) shifted by c1 from the first flow rate ratio is set so that the difference between the top and middle etching amounts becomes zero. That is, it is considered that the value of the difference between the top and middle etching amounts is displaced according to the linear function by the amount of shifting the $F_2/ClF_3$ flow rate ratio. The $F_2/ClF_3$ flow rate ratio is determined from the difference between the top and middle etching amounts obtained in the previously-processed wafer W so that the difference between the top middle etching amounts for the subsequent wafer W becomes 0 nm. The determination of the second flow rate ratio described above is performed by, for example, the controller 30. Although the difference between the top and middle etching amounts is shown to be 0 nm, control may be performed in the same manner so that the difference between the middle and bottom etching amounts becomes 0 nm. As described above, the shape control of the wafer W based on the above experiment is not limited to the control performed based on the shape of the wafer W before etching shown in FIGS. 5 to 8 and the like.

As described above, in each etching process performed by the etching apparatus 3, the magnitude relationship between the etching amount of the SiGe films facing the first recess 21 and the etching amount of the SiGe film 12 facing the second recess 22 is controlled. More specifically, it is possible to select which of the etching amount should be increased or made equal. As a result, control is performed so that the shapes of the stacked bodies 15 after etching are made uniform, i.e., becomes a desired shape. Further, the etching amounts of the top, middle and bottom SiGe film 12 of each stage facing the first recess 21 can also be controlled, and the shapes of the top, middle and bottom SiGe film 12, more specifically, the positions of the sidewalls of the SiGe films 12 at these heights can also be controlled.

In each of the above-described examples, the shapes of the stacked bodies 15 are made uniform by making the depths of the first lateral recesses 23 and the second lateral recesses 24 after etching equal. The processing conditions may be selected so that any of the first lateral recesses 23 and the second lateral recesses 24 becomes large. That is, the control of the etching amount is not limited to the control which is performed so that the shapes of the stacked bodies 15 are made uniform. Further, unlike the above-mentioned examples, the Si films 13 may not be interposed between the SiGe films 12, and only the SiGe films 12 may be provided between the mask film 14 and the base 11. In addition, the first recess 21 and the second recess 22 may not be opened in the longitudinal direction but may be opened in the lateral direction. That is, the sidewall of the recess is a sidewall seen from the bottom of the recess and is not limited to being located in the lateral direction.

In this example, the $F_2$ gas is used as the second fluorine-containing gas having a relatively low etching property for the SiGe films, and the $ClF_3$ gas is used as the first fluorine-containing gas having a relatively high etching property for the SiGe films. However, the present disclosure is not limited to such a combination of gases. Specifically, for example, an HF gas may be used as the second fluorine-containing gas, and a $SF_6$ gas, an $IF_5$ gas or an $IF_5$ gas may be used as the first fluorine-containing gas instead of the $ClF_3$ gas. Further, the germanium-containing film to be etched is not limited to the SiGe film and may be a germanium film.

According to the present disclosure in some embodiments, it is possible to allow a germanium-containing film after etching to have a desired shape.

It should be noted that the embodiments disclosed herein are exemplary in all respects and are not limitative. The above-described embodiments may be omitted, replaced, modified, or combined in various forms without departing from the scope and spirit of the appended claims.

What is claimed is:

1. An etching method, comprising:
accommodating a substrate having a recess formed by a sidewall, which is a germanium-containing film, into a processing container;
etching the sidewall by supplying an etching gas including a first fluorine-containing gas and a second fluorine-containing gas into the processing container; and
controlling a shape of the sidewall after etching by, in the etching the sidewall, adjusting a partial pressure of the first fluorine-containing gas in the processing container, or a ratio of a flow rate of the second fluorine-containing gas to a flow rate of the first fluorine-containing gas supplied into the processing container.

2. The etching method of claim 1, wherein the controlling the shape of the sidewall after etching includes adjusting the partial pressure of the first fluorine-containing gas in the processing container.

3. The etching method of claim 2, wherein the recess includes a first recess formed by a first sidewall and having a first width, and a second recess formed by a second sidewall and having a second width larger than the first width, and
the controlling the shape of the sidewall after etching includes controlling a magnitude of each of an etching amount of the first sidewall and an etching amount of the second sidewall in the etching the sidewall.

4. The etching method of claim 3, wherein the first fluorine-containing gas is a chlorine trifluoride gas, and
the controlling the shape of the sidewall after etching includes etching the sidewall at a partial pressure of the first fluorine-containing gas in a first range capable of changing the magnitude of each of the etching amount of the first sidewall and the etching amount of the second sidewall according to the ratio of the flow rate of the second fluorine-containing gas to the flow rate of the first fluorine-containing gas supplied into the processing container.

5. The etching method of claim 4, further comprising:
determining the ratio of the flow rate of the second fluorine-containing gas to the flow rate of the first fluorine-containing gas according to the substrate accommodated in the processing container.

6. The etching method of claim 5, wherein the first range is a range larger than $0.267 \times 10^{-1}$ Pa and smaller than $0.933 \times 10^{-1}$ Pa.

7. The etching method of claim 6, wherein the first fluorine-containing gas is a chlorine trifluoride gas, and
the controlling the shape of the sidewall after etching is performed at a partial pressure in a range selected according to the substrate accommodated in the processing container, among a partial pressure of the first fluorine-containing gas in a first range capable of changing the magnitude of each of the etching amount of the first sidewall and the etching amount of the second sidewall according to the ratio of the flow rate of the second fluorine-containing gas to the flow rate of the first fluorine-containing gas supplied into the processing container, a partial pressure of the first fluorine-containing gas in a second range in which the etching amount of the second sidewall is larger than the etching amount of the first sidewall, and a partial pressure in a third range in which the etching amount of the first sidewall is larger than the etching amount of the second sidewall.

8. The etching method of claim 7, wherein the sidewall of the recess is composed of a plurality of stages of germanium-containing films and a plurality of interstitial films interposed between a plurality of stages of germanium-containing films, and the controlling the shape of the sidewall after etching includes adjusting the ratio of the flow rate of the second fluorine-containing gas to the flow rate of the first fluorine-containing gas to control the shape of the germanium-containing film after etching in each of the plurality of stages of the sidewall.

9. The etching method of claim 8, wherein the germanium-containing film is a SiGe film.

10. The etching method of claim 4, wherein the first range is a range larger than $0.267 \times 10^{-1}$ Pa and smaller than $0.933 \times 10^{-1}$ Pa.

11. The etching method of claim 3, wherein the first fluorine-containing gas is a chlorine trifluoride gas, and the controlling the shape of the sidewall after etching includes etching the sidewall at a partial pressure of the first fluorine-containing gas in a second range in which the etching amount of the second sidewall is larger than the etching amount of the first sidewall.

12. The etching method of claim 11, wherein the second range is $0.933 \times 10^{-1}$ Pa or more.

13. The etching method of claim 3, wherein the first fluorine-containing gas is a chlorine trifluoride gas, and the controlling the shape of the sidewall after etching includes adjusting the partial pressure of the first fluorine-containing gas to a partial pressure in a third range in which the etching amount of the first sidewall is larger than the etching amount of the second sidewall.

14. The etching method of claim 13, wherein the third range is $0.267 \times 10^{-1}$ Pa or less.

15. The etching method of claim 3, wherein the first fluorine-containing gas is a chlorine trifluoride gas, and the controlling the shape of the sidewall after etching is performed at a partial pressure in a range selected according to the substrate accommodated in the processing container, among a partial pressure of the first fluorine-containing gas in a first range capable of changing the magnitude of each of the etching amount of the first sidewall and the etching amount of the second sidewall according to the ratio of the flow rate of the second fluorine-containing gas to the flow rate of the first fluorine-containing gas supplied into the processing container, a partial pressure of the first fluorine-containing gas in a second range in which the etching amount of the second sidewall is larger than the etching amount of the first sidewall, and a partial pressure in a third range in which the etching amount of the first sidewall is larger than the etching amount of the second sidewall.

16. The etching method of claim 1, wherein the sidewall of the recess is composed of a plurality of stages of germanium-containing films and a plurality of interstitial films interposed between a plurality of stages of germanium-containing films, and the controlling the shape of the sidewall after etching includes adjusting the ratio of the flow rate of the second fluorine-containing gas to the flow rate of the first fluorine-containing gas to control the shape of the germanium-containing film after etching in each of the plurality of stages of the sidewall.

17. The etching method of claim 1, wherein the germanium-containing film is a SiGe film.

* * * * *